US011309216B2

(12) United States Patent
Reznicek et al.

(10) Patent No.: US 11,309,216 B2
(45) Date of Patent: Apr. 19, 2022

(54) LARGE GRAIN COPPER INTERCONNECT LINES FOR MRAM

(71) Applicant: International Business Machines Corporation, Armonk, NY (US)

(72) Inventors: Alexander Reznicek, Troy, NY (US); Oleg Gluschenkov, Tannersville, NY (US); Yasir Sulehria, Latham, NY (US); Devika Sil, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 233 days.

(21) Appl. No.: 16/773,939

(22) Filed: Jan. 27, 2020

(65) Prior Publication Data

US 2021/0233812 A1    Jul. 29, 2021

(51) Int. Cl.
H01L 21/768     (2006.01)
H01L 27/22      (2006.01)
H01L 43/12      (2006.01)
H01L 23/532     (2006.01)

(52) U.S. Cl.
CPC .. *H01L 21/76883* (2013.01); *H01L 21/76843* (2013.01); *H01L 23/53238* (2013.01); *H01L 27/228* (2013.01); *H01L 43/12* (2013.01)

(58) Field of Classification Search
CPC ......... H01L 21/76883; H01L 21/76843; H01L 23/53238; H01L 27/228
See application file for complete search history.

(56) References Cited

U.S. PATENT DOCUMENTS

| | | | |
|---|---|---|---|
| 6,103,624 A | 8/2000 | Nogami et al. | |
| 6,835,657 B2 | 12/2004 | Ong | |
| 7,138,717 B2 | 11/2006 | Wang et al. | |
| 8,866,242 B2 | 8/2014 | Li et al. | |
| 9,412,658 B2 | 8/2016 | Gluschenkov et al. | |
| 10,361,364 B2 | 7/2019 | Clevenger et al. | |
| 2003/0168684 A1 | 9/2003 | Pan et al. | |
| 2007/0297218 A1 | 12/2007 | Abraham et al. | |
| 2009/0206484 A1 | 8/2009 | Baker-O'Neal et al. | |
| 2013/0062769 A1 | 3/2013 | Cabral, Jr. et al. | |
| 2013/0187273 A1 | 7/2013 | Zhang et al. | |

(Continued)

FOREIGN PATENT DOCUMENTS

| | | |
|---|---|---|
| CN | 1435841 A | 8/2003 |
| CN | 101090129 A | 12/2007 |

OTHER PUBLICATIONS

Tang, Yingyan, International Search Report and Written Opinion, PRC as ISA, Counterpart PCT Application PCT/IB2021/050037, dated Apr. 9, 2021. pp. 9.

(Continued)

*Primary Examiner* — Robert G Bachner
(74) *Attorney, Agent, or Firm* — Randall Bluestone; Otterstedt, Wallace & Kammer, LLP

(57) ABSTRACT

Large grain metal bitlines are formed above magnetic tunnel junction pillars used as MRAM bits without materially affecting the magnetic properties of the magnetic tunnel junctions. A copper or copper alloy bitline having relatively small grains is formed over the pillars. Laser annealing is employed to melt the bitline. Subsequent cooling and recrystallization results in a reduction of the number of grain boundaries in the bitline and a reduction in bitline effective resistivity. Multiple melt/cool cycles may be used. Bitline grains are vertically aligned with the pillars in a resulting structure.

15 Claims, 7 Drawing Sheets

(56) References Cited

U.S. PATENT DOCUMENTS

| | | |
|---|---|---|
| 2015/0348832 A1 | 12/2015 | Bruce et al. |
| 2016/0365505 A1 | 12/2016 | Lu et al. |
| 2018/0366640 A1 | 12/2018 | Clevenger et al. |
| 2019/0273204 A1 | 9/2019 | Clevenger et al. |
| 2019/0280196 A1 | 9/2019 | Clevenger et al. |
| 2019/0393265 A1 | 12/2019 | Ying et al. |
| 2020/0006425 A1 | 1/2020 | Lin et al. |

OTHER PUBLICATIONS

Bosman et al., Encapsulated annealing: Enhancing the plasmon quality factor in lithographically-defined nanostructures. Scientific reports, 4, Jul. 2, 2014 5Pages 537-1 to 6.

Anonymous, Method to create a thin large copper grain copper film from ECD copper for copper subtractive etch integration approach, ip.com Publication No. 000239887D, Dec. 9, 2014, pp. 1-6.

Anonymous, Method for copper-film grain growth by changing the film stress, ip.com Publication No. 000146542D, Feb. 16, 2007 pp. 1-5.

Durham et al., A 1-Mbit MRAM Based on 1t1MTJ Bit Cell Integrated with Copper Interconnects, IEEE Solid-State Circuits 38 (2003) pp. 769-773.

Lee, Rinus TP et al., Nanosecond Laser Anneal for BEOL Performance Boost in Advanced FinFETs, 2018 IEEE Symposium on VLSI Technology, 2018, pp. 61-62.

Murray et al., Unpublished U.S. Appl. No. 16/003,766, filed Jun. 8, 2018, Controlling Grain Boundaries in High Aspect-Ratio Conductive Regions, pp. 1-24 plus 9 sheets of drawings (YOR8-2016-2144).

LARGE GRAIN COPPER INTERCONNECT LINES FOR MRAM

BACKGROUND

The present invention relates generally to the electrical, electronic and computer arts and, more particularly, to copper interconnect lines for arrays of magnetic tunnel junction (MTJ) memory devices.

Magnetic tunnel junction stacks are suitable for use in various electronic applications, including non-volatile memory devices and magnetic field sensors. Magnetic random access memory (MRAM) can, for example, offer faster operational speed than flash memory. MRAM devices may be able to replace dynamic random access memory (DRAM) devices in some applications.

Magnetic tunnel junctions include two magnetic layers and a tunnel barrier layer positioned between the magnetic layers. The magnetic layers can be characterized as "reference" and "free" layers, respectively while the tunnel barrier can be a thin tunneling oxide layer. The magnetization direction of one layer of the junction is fixed so that it serves as the reference layer. The magnetization of the free layer can be determined by an electrical input. A MTJ includes two stable resistance states for digital memory applications and multiple states for neuromorphic applications. Charge current from the reference layer to the free layer causes the MTJ to switch between states by overcoming the energy barrier.

Silicon-based devices typically include multiple interconnect metallization layers above a device (front-end-of-line/FEOL) layer that contains field-effect transistors (FETs) or other structures. FEOL processing includes high-temperature steps for manipulating semiconductor conductivity. Middle-of-line (MOL) processing includes steps typically used for fabricating metal contacts for logic circuitry components such as field-effect transistors (FETs), resistors, diodes, and capacitors. MOL processing includes intermediate-temperature steps for forming semiconductor-metal compounds (silicides, germanosilicides) for electrical contacts. Back-end-of-line (BEOL) processing involves the creation of metal interconnecting wires that connect the devices formed in FEOL processing to form electrical circuits. The metal lines including the interconnecting wires are deposited in sequence (e.g. M1, M2, M3, etc.) above the FEOL layer and include dielectric layers comprising trenches and vias therein that are filled with electrical conductors. Trench openings are conventionally formed in the dielectric layer by using, for example, known damascene or dual damascene techniques. M2 and M3 lines may have wider pitches than the M1 line. The interconnecting wires within each metal line are electrically connected to interconnecting wires in other metal lines and to the devices in the FEOL layer. BEOL processing includes low-temperature steps for forming metal wires and preserving temperature sensitive FEOL and MOL structures. Dense MTJ structures (MRAM bits) are formed in the BEOL layer for memory and neuromorphic applications. Low-temperature BEOL processes preserve delicate MTJ devices where both magnetic and tunneling layers are highly sensitive to excessive temperature treatments during post processing. These dense MTJ memory cells require narrow metal lines for access. The narrow wires run above and below the MTJ memory cells. The access speed and the maximum size of single memory bank or array depends on the narrow wire resistance with a faster access speed and a larger single array obtained at a lower wire resistance.

Damascene copper wires are chosen to reduce the wire resistance due to superior electrical conductivity of copper. However, lateral and vertical scaling of copper wires to beyond 40 nm leads to a nonlinear rise of copper wire resistance known as the interconnect size effect or alternatively the copper wire size effect. The physical mechanism behind the size effect is the electron diffused scattering off the wire grain boundaries and interfaces. Average copper grain size scales down with wire dimensions and is typically comparable to the wire width. The interconnect size effect becomes the dominant constraint for achieving low resistance in narrow copper wires.

BRIEF SUMMARY

Large grain copper interconnect lines for MRAM are formed without materially affecting the magnetic properties of MTJ stacks of non-volatile memory devices.

A method of forming large grain copper bitlines for an electronic structure includes obtaining an MRAM structure including a device wafer comprising electronic devices, a metallized layer over the device wafer and including bottom electrodes therein, the bottom electrodes being electrically connected to the electronic devices, and vertical pillars having sidewalls above the metallized layer, the vertical pillars each including a magnetic tunnel junction and a top electrode. A copper bitline exhibiting a copper wire size effect is formed over the top electrodes. The copper bitline has a width of forty nanometers or less, an area of three thousand square nanometers or less, and copper grains having relatively small sizes with respect to the width of the copper bitline. Laser annealing the copper bitline causes the melting of the copper bitline. The method further includes recrystallizing the copper bitline during a cool down period following the laser annealing, thereby forming relatively large grains therein and reducing the copper wire size effect of the copper bitline formed over the top electrodes.

A further method of forming large grain copper bitlines for an electronic structure includes obtaining an MRAM structure including vertical pillars having a pitch of sixty nanometers or more, each of the vertical pillars including a magnetic tunnel junction and a top electrode, a plurality of spaces respectively between and separating each of the vertical pillars, and a dielectric layer filling each of the plurality of spaces between the vertical pillars. A copper bitline is formed over the top electrodes and along the pitch of the vertical pillars. The copper bitline extends over the spaces between the vertical pillars and has a width of forty nanometers or less, an area of three thousand square nanometers or less, and copper grains having relatively small sizes with respect to the width of the copper bitline. The method further includes laser annealing the copper bitline thereby melting the same and recrystallizing the copper bitline during a cool down period following the laser annealing. Relatively large grains are formed that are vertically aligned, respectively, with the vertical pillars. The large grains have grain boundaries located mostly over the dielectric layer that occupies the spaces between the vertical pillars.

In a further aspect of the invention, a magnetoresistive random access memory structure includes a plurality of vertical pillars having sidewalls. Each of the plurality of vertical pillars includes a magnetic tunnel junction and a top electrode. The pillar pitch of the plurality of pillars is sixty nanometers or more. The memory structure further includes a plurality of spaces, each of the plurality of spaces being respectively between an opposing pair of the sidewalls of adjacent vertical pillars. A dielectric layer fills each of the plurality of spaces. A copper bitline is above and electrically connected to each top electrode. The copper bitline has a line width of forty nanometers or less, grains having a grain size larger than twice the line width, and an average grain size of 0.06 µm or greater. The pillar pitch is along the copper bitline.

Techniques and structures as disclosed herein can provide substantial beneficial technical effects. By way of example only and without limitation, one or more embodiments may provide one or more of the following advantages:

Reduction of copper grain boundaries within copper lines above MTJ stacks;

Reduction of electrical resistance on copper lines above MTJ stacks without affecting the magnetic properties of the MTJ stacks;

Enables fast access speed to MRAM arrays.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Figure 1:
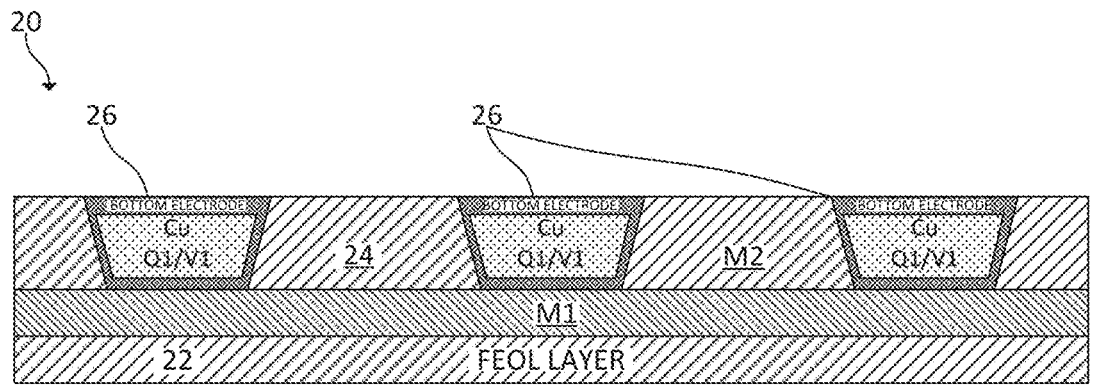
FIG. 1 is a schematic, cross-sectional view showing a device wafer including FEOL devices/circuits, a first level metal layer on the device wafer, and a second level metal layer including bottom electrodes.

Access times and overall circuit performance can be potentially enhanced by integrating memory devices close to the FEOL layer rather than in special sections on a chip or using a separate dedicated memory chip. An MRAM is one type of memory device that can be integrated with BEOL CMOS processing just above the FEOL layer, for example between the M2 and M3 lines or layers. A monolithic structure 20 shown in FIG. 1 is obtained following FEOL processing and formation of metal lines M1 and M2. The FEOL layer includes electronic devices such as field-effect transistors (FETs) that comprise integrated circuits. The first metal layer M1 includes contacts and via conductors (not shown) that are electrically connected to the electronic devices in the FEOL layer 22. The second metal layer M2 includes copper lines that are electrically connected to the M1 layer. The memory cell structure can include one access transistor or can be of cross-point type where all active elements (transistors) are located at the array periphery. In either case, the MTJ memory element has two connections through M2 metal lines at the bottom and through M3 metal lines at the top. The bottom M2 line of a MTJ MRAM cell connects to the source of an NFET access transistor while top M3 line of a MTJ MRAM cell connects to array periphery circuitry. Both M3 and M2 lines can be referred as the bitline. For a cross-point MRAM memory cell, both M2 and M3 metal lines connect to array periphery circuitry. A large memory array or bank results in long M3 connecting metal lines. In some embodiments, as many as 64,000 individual MTJ cells or bits are connected to a single M3 bitline. Dense memory arrays require narrow M2 and M3 metal lines and tight M2 and M3 pitches. Long and narrow M3 lines introduce a substantial memory access time penalty that, in turn, sets a limit to the maximum array or memory bank size. Increasing number of memory arrays or banks per memory die penalizes the overall memory density due to replicating periphery circuitry. Accordingly, there is a continuous need of reducing resistance of long and narrow bitlines thereby enabling faster access times and/or larger individual memory arrays.

Trench openings are conventionally formed in an ILD layer 24 by using, for example, known damascene techniques. Photolithography and etching steps follow ILD layer deposition. Specifically, a photoresist (not shown) is applied over the ILD layer. The photoresist can be applied by any suitable technique, including, but not limited to coating or spin-on techniques. A mask (not shown), which is patterned with shapes defining trench openings (and possibly contact holes) to be formed, is provided over the photoresist, and the mask pattern is transferred to the photoresist using a photolithographic process, which creates recesses in the uncovered regions of the photoresist. The patterned photoresist is subsequently used to create the same pattern of recesses in the ILD dielectric layer through conventional etching typically used for forming trenches and contact holes. A dry etch (for example, a reactive ion etch) may be employed to form such trenches and contact holes. The etching selectively removes a portion of the ILD layer 24. The depth(s) of the trench openings can be controlled by using a timed etching process. Alternatively, the dielectric layer may include multiple layers that may be selectively etched. In such a case, the etch process selectively removes the upper layer(s) of the ILD layer, stopping at a lower layer thereof that forms an etch stop. After formation of the trench openings, the photoresist may be stripped by ashing or other suitable process from the ILD layer. The resulting structure may be subjected to a wet clean.

A further stage in the fabrication process includes depositing a conformal layer of liner material. The conformal layer of liner material lines the sidewalls and bottom surfaces of the trenches or other openings within the ILD layer 24. The liner material may include one or more thin layers of material such as, for example, tantalum (Ta), tantalum nitride (TaN), titanium nitride (TiN), cobalt (Co), ruthenium (Ru), tungsten (W), tungsten nitride (WN), titanium-tungsten (TiW), tungsten nitride (WN) manganese (Mn), manganese nitride (MnN) or other liner materials (or combinations of liner materials) such as RuTaN, Ta/TaN, CoWP, NiMoP, NiMoB which are suitable for the given application. The thin liner serves as a barrier diffusion layer and adhesion layer. The conformal layer of liner material is deposited using known techniques such as CVD, ALD, or PVD. A thin conformal copper (Cu) seed layer can be deposited over the surface of the liner using PVD, followed by the electroplating of Cu to fill the damascene (or dual damascene) openings in the ILD layer. A thermal anneal stage follows electroplating.

The overburden liner, seed, and metallization materials are then removed by performing a three step chemical mechanical polishing process (CMP) to planarize the surface of the semiconductor structure down to the ILD layer 24. A metal cap layer (not shown) may be selectively deposited on the exposed metal interconnect layer within the trenches. For example, metals such as cobalt, ruthenium or manganese may be deposited using chemical vapor deposition or atomic layer deposition to form the metal cap layers. Post-deposition cleaning may be required to ensure there is no leakage or degradation resulting from possible metal residues on the resulting structure.

The M2 layer may alternatively be referred to as the bottom or lower line of the memory element or cell or bottom portion of the bitline. An SiCOH dielectric film having a dielectric constant (k) of about 2.7-2.8 can be employed in forming the M2 layer. Such a dielectric film can be deposited using PECVD. The film is patterned as described above to form trenches that are later filled with copper to form bottom electrodes 26. The copper electrodes preferably have relatively low resistance. Low resistance electrodes can be obtained by annealing and recrystallization of the deposited metal.

Figure 2:
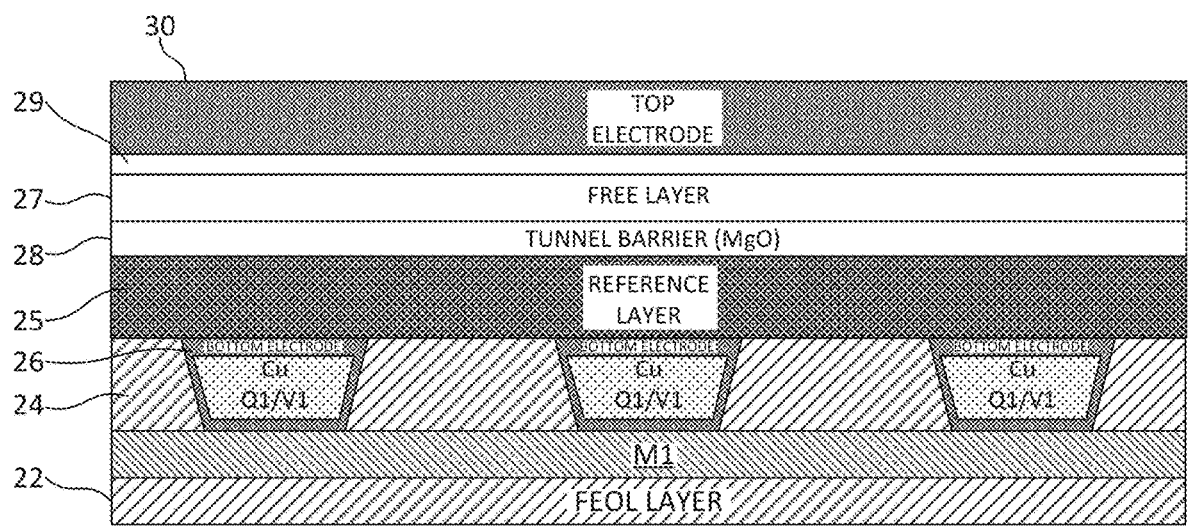
FIG. 2 is a schematic, cross-sectional view showing an exemplary MTJ stack, a dielectric cap, and an electrode layer over the second level metal layer.
Figure 3:
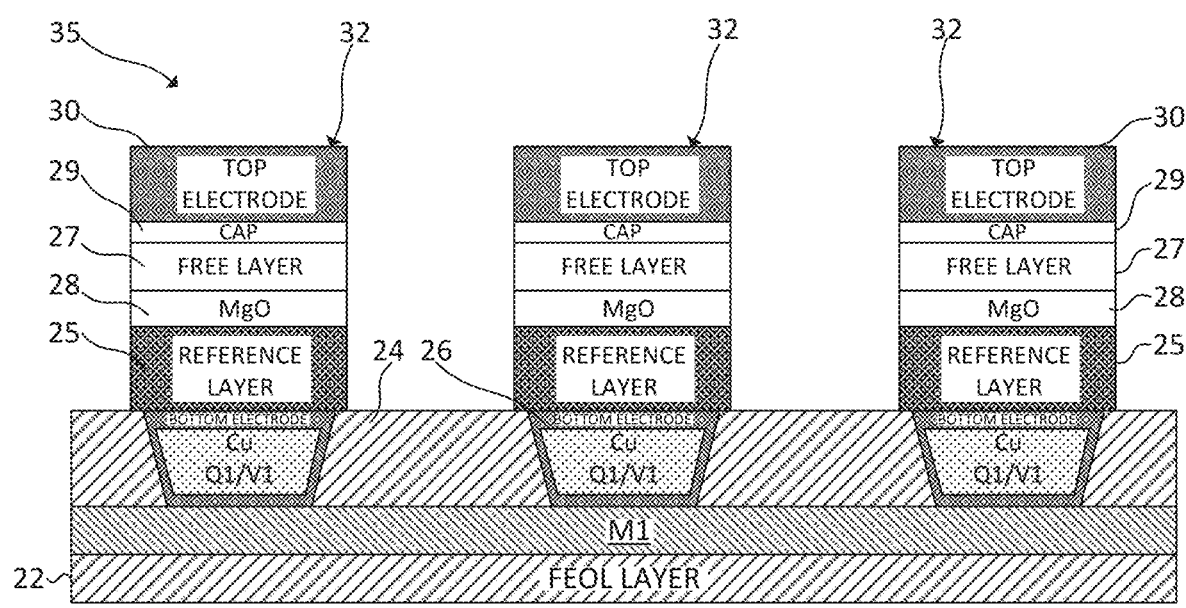
FIG. 3 is a schematic, cross-sectional view showing the structure of FIG. 2 following formation of MTJ pillars from the layers of the MTJ stack.

Referring to FIG. 2, MTJ stack films are deposited using, for example, physical vapor deposition (PVD) or ion beam deposition (IBD). The tunnel barrier layer 28 can be formed by oxidizing a metal layer without oxidizing the underlying reference layer 25. A metal capping layer 29 is formed over the free layer 27. The capping layer can, for example, be composed of Nb, NbN, W, WN, Ta, TaN, Ti, TiN, Ru, Mo, Cr, V, Pd, Pt, Rh, Sc, Al or other high melting point metals or conductive metal nitrides. The capping layer 29 can have a thickness from two (2) nm to twenty-five (25) nm. A top electrode layer 30 is formed over the capping layer. The top electrode 30 can be composed of Ta, TaN, Ti, TiN, Ru, RuN, RuTa, RuTaN, Co, CoWP, CoN, W, WN or any combination thereof. The top electrode 30 can have a thickness from two (2) nm to twenty-five (25) nm. The patterning of the MTJ stack films to form pillars 32, several of which are shown in FIG. 3, is accomplished by a stack etching process. Ion milling (ion beam etching or IBE) is an effective MTJ stack etching technique. Dielectric caps (not shown) are formed from a hard mask (not shown) adjoining the top surfaces of the top electrode layer 30. The dielectric caps may comprise silicon nitride or other composition suitable for ion beam etching of the MTJ stack film. The dielectric caps are removed subsequent to ion beam etching.

Referring again to the exemplary structure shown in FIG. 3, MTJ stacks are shown following deposition and patterning of the hard mask, ion beam etching of an MTJ stack film, and hard mask removal. The etching of the MTJ stack film results in the formation of vertical pillars 32 from the stack film, each of the pillars including a magnetic tunnel junction comprised of a tunnel barrier layer 28 between a reference layer 25 and a free layer 27. Aluminum oxide and magnesium oxide are among the compounds that may form the tunnel barrier layer. The tunnel barrier layer 28 is made as thin as possible and typically just 3 nm or less, to allow for a significant tunneling current. Ultra-thin tunnel barrier layer 28 makes the MTJ structure sensitive to high-temperature thermal treatments, for the adjacent metal element can diffuse into and through such ultra thin-layer changing its properties. Annealing of formed MTJ with ultra-thin tunnel barrier 28 in excess of 500° C. is typically avoided. The free layer 27 may be formed of magnetically active metal such as Fe and/or Co, FeCoB, and combinations thereof as well as other interlayers known in the art, and may comprise multiple layers. The reference layer 25 adjoins a bottom electrode 26 formed within the electrically insulating (ILD) interlayer 24 and may comprise multiple layers, including a pinning layer, ferromagnetic layers and a spacer layer between the ferromagnetic layers. Exemplary materials for forming the magnetic reference layer include iron, nickel, cobalt, chromium, boron, manganese, and alloys thereof. A large single array of MTJ pillars (MRAM bits) may be formed (64 kb to 256 Mb, or larger). Large single arrays of MTJ pillars can be replicated several times to get to the target capacity per product die (e.g. to one (1) Gb). The MTJ pillars may, in some embodiments, form a "checkerboard" pattern, the pillar spacing (pitch) along a subsequently formed top bitline being sixty nanometers or more.

The interlayer 24 may, for example, be formed from silicon oxide or a low-k dielectric material such as SiCOH as described above and include multiple dielectric sub-layers. Chemical vapor deposition (CVD), including plasma-enhanced CVD, may be used for the deposition of low-k (k less than 4.0) dielectric materials such as porous SiCOH). The bottom electrodes 26 are electrically connected to metal contact vias Q1/V1 which are, in turn, electrically connected to the M1 layer. Portions of the metal capping layer 29 adjoin the top surface of the free layer of each exemplary pillar 32. The top electrode layer 30 adjoins the top surface of the metal capping layer 29 of each pillar and forms top electrodes, as shown in FIG. 3. The layers of the pillars 32 are not necessarily drawn to scale.

An encapsulation layer 34 is formed over the MTJ pillars 32. The encapsulation layer may comprise a plurality of layers. For example, a manganese oxide or other oxide (e.g. metal silicate or metal oxynitride) compound can be formed on the MTJ pillars followed by deposition of a conformal dielectric layer such as silicon nitride. Barrier properties may be enhanced by encapsulating the pillars and the optional oxygen-containing barrier layer with a silicon nitride layer. In embodiments wherein the encapsulation layer is a conformal layer of silicon nitride, a layer thickness of twelve to fifteen nanometers is formed in one or more exemplary embodiments. The silicon nitride layer extends over the pillars 32 as well as top surfaces of the M2 layer. A silicon nitride layer having a thickness of five to six nanometers is sufficient to provide an acceptable copper and oxygen diffusion barrier when employed in conjunction with, for example, an underlying manganese silicate layer two to three nanometers in thickness that adjoins the sidewalls of the pillars. A combined manganese silicate/silicon nitride diffusion barrier will have a lower average dielectric constant (k) than barriers consisting only of silicon nitride. Relatively thin copper/oxygen diffusion barrier layers enable nano-MTJ device fabrication compatible with advanced CMOS scaling.

In some embodiments, a liner is deposited on a MnSiOx layer to improve barrier properties. A manganese nitride (MnN) liner having a thickness of one to five nanometers (1-5 nm) may, for example, be employed. Such a liner may be deposited using atomic layer deposition (ALD) or chemical vapor deposition (CVD). A MnSiOx/MnN barrier layer provides an effective oxidation barrier as well as a barrier to copper diffusion. In some embodiments, a 2-3 nm MnSiOx layer and a 5 nm MnN liner are employed to form a barrier on the MJT pillars 32. In embodiments including an MnN liner, stable phase MnNx material such as $Mn_3N_2$ or $Mn_4N$ are preferred because the excess Mn will act as an oxygen scavenger and in turn become a good/better oxidation barrier. In embodiments wherein $MnO_x$ is either formed or deposited on the sidewalls of the pillars 32, the value of x is preferably less than two (2) to function as an oxygen scavenger and serve as an oxygen barrier. In a preferred embodiment, $1.5<x<1.0$.

Techniques for encapsulating MTJ pillars within diffusion/oxidation barriers and oxidizing residue may, for example, involve the direct deposit of $MnO_x$ or $MnSiO_x$ on the entire structure 35 shown in FIG. 3 or the selective deposition of Mn followed by oxidation thereof. Oxidized barrier material can be deposited using atomic layer deposition (ALD), thereby encapsulating the MTJ pillars 32 and extending over the M2 wiring layer. The oxygen in the deposited compound may oxidize residue that may be present on the MTJ pillars. Manganese oxide has a plurality empirical formulas, for example $MnO$, $MnO_2$, $MnO_3$, $Mn_3O_4$ and $Mn_2O_3$. In some embodiments, manganese oxide having a relatively high oxygen content is deposited nearest to the MTJ pillar while a manganese oxide compound having a lower oxygen content is deposited later in the deposition process, forming a graded diffusion barrier. The inner portions of the diffusion barrier layers may ultimately have relatively lower oxygen concentrations once the oxygen therein is used for oxidation of the metallic residue. The oxygen content of ALD-deposited $MnSiO_x$ can likewise be graded, with higher oxygen content at least originally in the regions adjoining the pillars 32 where metallic residue requiring oxidation is expected. In embodiments wherein $MnSiO_x$ is deposited on the MTJ stack using plasma-enhanced atomic layer deposition, the atomic percent composition of manganese, silicon and oxygen is 12.8%, 28.5% and 58.7%, respectively in some embodiments. The composition of the manganese silicate film adjoining the MTJ stack in some embodiments may accordingly be given as $Mn(SiO_2)_2$. It will be appreciated that a $MnSiO_x$ layer as employed herein may not be entirely uniform in composition, nor is such uniformity required. For example, a manganese silicate ($Mn(SiO_2)_2$) layer as described may have an atomic concentration of manganese ranging between 13.7% and 11.9%, a silicon concentration ranging between 31.2% and 25.9% and an oxygen concentration ranging between 61.2% and 56.2%. Manganese silicate as described herein has a dielectric constant of about 3.7 as compared to 6.8-7.0 for silicon nitride.

Figure 5:
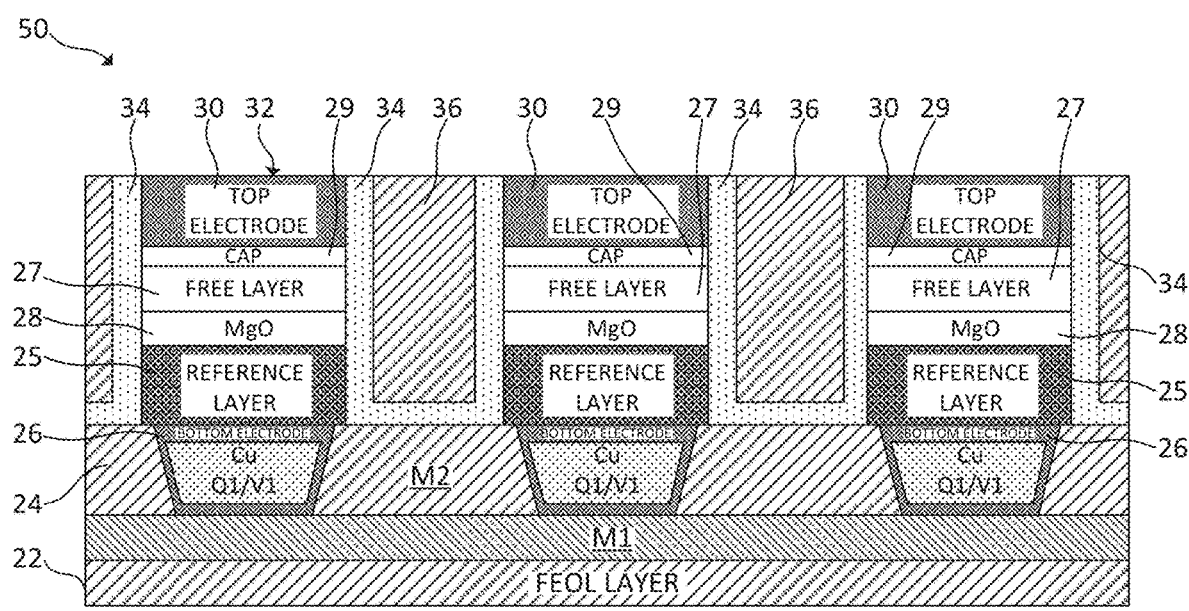
FIG. 5 is a schematic, cross-sectional view thereof following deposition of an interlevel dielectric layer and planarization.

An interlevel dielectric (ILD) layer 36 is deposited over the encapsulation layer 34 of the structure 40. The ILD layer 36, like interlayer 24, may be formed from silicon oxide or a low-k dielectric material such as SiCOH as described above and may include multiple dielectric sub-layers. Deposition processes for ILD layer 36 should have a gap fill capability due to underlying topography, e.g. ability to fill in between MTJ pillars. Due to this reason deposition of flowable ILD materials is preferred. Chemical vapor deposition (CVD), including plasma-enhanced CVD, may be used for the deposition of low-k (k less than 4.0) dielectric materials such as porous SiCOH. Alternatively, a spin-on deposition of flowable low-k material can be employed. The ILD layer 36 fills the spaces between the pillars 32 and adjoins the encapsulation (barrier) layer 34. The ILD layer 36 can be optionally cured using various known curing techniques including UV-light-assisted cure at below 400° C. The resulting structure is then subjected to chemical mechanical planarization (CMP) down to the top surfaces of the top electrodes 30 to obtain a structure 50 as schematically illustrated in FIG. 5.

A top copper bitline 38 or, equivalently, the MRAM bitline is formed using an upper metallization layer such as M3. The M3 layer is formed similar to M2 layer using damascene methods. An ILD layer (not shown) is first deposited over MTJ pillar 32, encapsulation layer 34, and ILD material 36. Trench openings are conventionally formed in the ILD layer by using known damascene techniques. Specifically, a photoresist (not shown) is applied over the ILD layer. The photoresist can be applied by any suitable technique, including, but not limited to coating or spin-on techniques. A mask (not shown), which is patterned with shapes defining trench openings (and possibly contact vias) to be formed, is provided over the photoresist, and the mask pattern is transferred to the photoresist using a photolithographic process, which creates recesses in the uncovered regions of the photoresist. The patterned photoresist is subsequently used to create the same pattern of recesses in the ILD dielectric layer through conventional etching typically used for forming trenches and contact vias. A dry etch (for example, a reactive ion etch) may be employed to form such trenches and contact vias. The etching selectively removes a portion of the ILD layer. The depth(s) of the trench openings can be controlled by using a timed etching process. Alternatively, the dielectric layer may include multiple layers that may be selectively etched. In such a case, the etch process selectively removes the upper layer(s) of the ILD layer, stopping at a lower layer thereof that forms an etch stop. After formation of the trench openings, the photoresist may be stripped by ashing or other suitable process from the ILD layer. The resulting structure may be subjected to a wet clean. The contact vias of this M3 level make a direct contact with top electrodes 30 of MTJ pillars 32 to form a MRAM bitline. In some embodiments, the width of M3 bitline trench is from 15 nm to 40 nm and its depth is from 30 nm to 80 nm or roughly twice its width. In some embodiments, M3 bitline pitch is twice or four times larger than the M3 bitline trench width or from 30 nm to 160 nm.

A further stage in the fabrication process includes depositing a conformal conductive layer of liner material 39. The conformal layer of liner material lines the sidewalls and bottom surfaces of the trenches or other openings within the ILD in which the top copper bitline is formed. The liner material 39 may include one or more thin layers of material such as, for example, tantalum (Ta) and/or ruthenium (Ru). Other liner materials (or combinations of liner materials) which are suitable for the given application may alternatively be employed. The thin liner serves as a barrier diffusion layer and adhesion layer. The conformal layer of liner material 39 is deposited using known techniques such as CVD, ALD, or PVD. In some embodiments, the adhesion or copper wetting layer is deposited over barrier material (e.g. TaN) and comprises materials immiscible with the liquid copper such as Ta or Ru. Materials such as cobalt, which are miscible with liquid copper, are not employed as liner materials in the preferred embodiments. The overall thickness of liner 39 is from three (3) nm to six (6) nm. A thin copper (Cu) seed layer can be deposited over the surface of the liner using PVD, followed by the electroplating of Cu (the MRAM bitline 38) to fill the damascene (or dual damascene) openings in the ILD layer of the M3 level of the structure. A low-temperature thermal anneal (<200° C.) follows electroplating.

The overburden liner, seed, and metallization materials are then removed by performing a three step chemical mechanical polishing process (CMP) to planarize the surface of the semiconductor structure down to the top surface of M3 ILD layer (not shown). A metal cap layer (not shown) may be selectively deposited on the exposed metal bitline layer within the trenches. For example, metals such as cobalt, ruthenium or manganese may be deposited using chemical vapor deposition or atomic layer deposition to form the metal cap layers. In some embodiments, the metal cap layer comprises materials immiscible with liquid copper such as Ta or Ru. Post-deposition cleaning may be required to ensure there is no leakage or degradation resulting from possible metal residues on the resulting structure. In some embodiments, the cross-sectional copper area of M3 bitline 38 is from 300 $nm^2$ to 3000 $nm^2$. M3 metal bitlines 38 typically run orthogonally to M2 metal lines, forming a cross-point at their intersection.

A top dielectric capping layer 42 is deposited sequentially on the formed M3 metal bitlines and associated vias that electrically connect the M3 bitlines to the top electrodes 30. The top dielectric capping layer comprises an essentially non-porous dielectric material in preferred embodiments of the invention. A low-k silicon carbonitride material such as NBLoK™ may be deposited on the M3 metal bitline 38 using plasma enhanced chemical vapor deposition at 375° C. This material comprises Si, C, O, H, and N and is marketed by Applied Materials, Inc. Silicon nitride and silicon oxynitride are non-limiting examples of other materials that can be deposited on the top copper line 38. The top capping layer 42 may include multiple layers in some embodiments.

Figure 6:
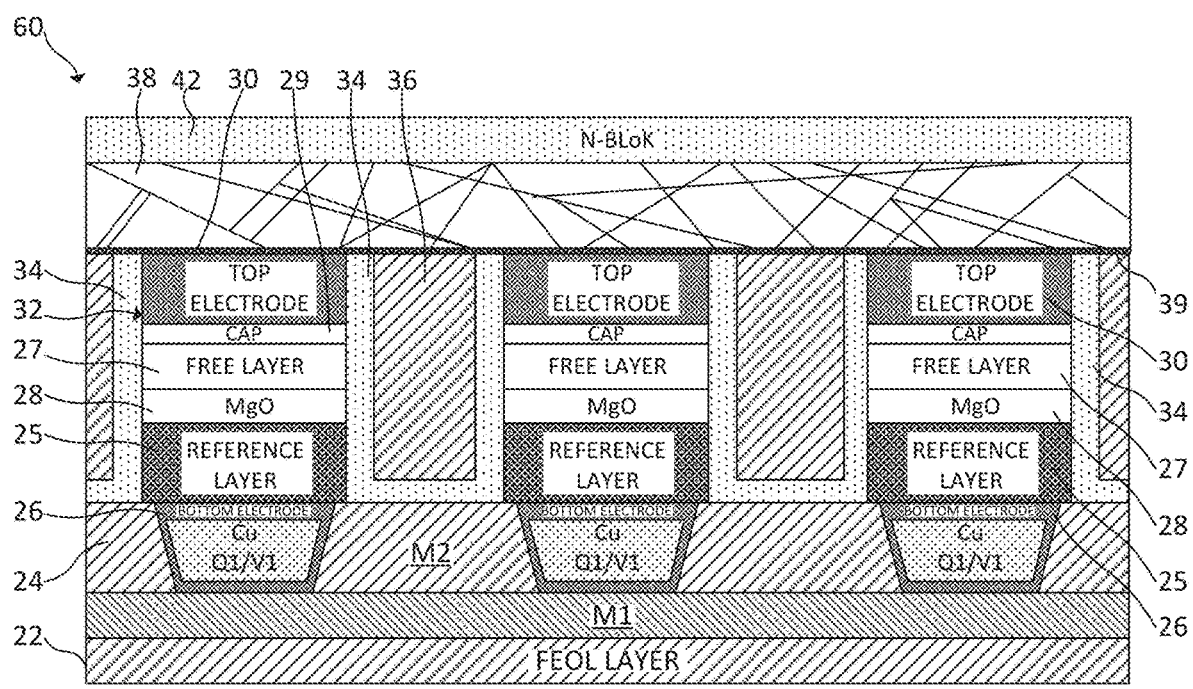
FIG. 6 is a schematic, cross-sectional view

Deposition of the dielectric capping layer 42 provides a desirable thermal treatment at 375° C. of formed copper metal bitlines 38 and associated vias. As the result of this treatment, average grain size of the copper slightly increases, but remains relatively small and is typically less than the width of copper portion of the M3 metal bitline 38. Specifically, the average copper grain size is less than 40 nm for copper line width of 40 nm or less. Accordingly, the resultant copper bitline 38 has relatively small grains and a high number of grain boundaries. Such boundaries are illustrated in FIG. 6. Notwithstanding described layer 39 with its diffusion barriers, adhesion or wetting layers, and metallic caps, the M3 metal bitline 38 is essentially an elemental copper structure with a low level of impurities inadvertently introduced during deposition processes or, alternatively, a copper alloy that will melt in a temperature range similar to elemental copper. Elemental copper melts at about 1090° C. The term "copper bitline" accordingly encompasses elemental copper bitlines, possibly containing impurities, as well as copper alloy bitlines that melt at or below about 1150° C.

Copper line resistance per unit length is determined by two factors: copper resistivity and copper wire cross-sectional area. For standard macro-size wires, the copper resistivity is a material property independent of wire cross-sectional area and the wire resistance per unit length is the copper resistivity divided by the copper cross-sectional area. For nano-sized wires such as the case of M3 metal bitline 38, this relationship breaks down and the wire resistivity becomes dependent on the wire geometry. This is due to the fact that electrons within a copper nanowire collide with and transfer momentum into the wire walls and grain boundaries more often than into the copper lattice vibrations and copper crystal imperfections. The average distance between electron collisions, known as an electron mean free path, in bulk copper is about 40 nm. Once the wire cross-sectional dimensions become comparable to or smaller than the electron mean free path in bulk copper or ~40 nm, the interfacial and grain boundary electron collisions cause the wire resistivity to go up. This effect is known as the interconnect size effect and the resultant nanowire resistivity, known as the effective resistivity of copper nanowires, is defined as a product of measured copper wire resistance per unit length and the copper cross-sectional area. For instance, the effective copper wire resistivity of a 80-nm wide line is approaching that of bulk copper resistivity which is about 1.7 μΩ cm whereas the effective resistivity of a 18-nm wide line with the copper cross-sectional area of about ~300 $nm^2$ is more than five (5) times higher at about ~9 μΩ cm.

Growth of large copper grains in narrow copper wires can reduce the effective copper resistivity, partially reversing the interconnect size effect. Making average copper grain size larger than about 80 nm can virtually eliminate grain boundary scattering component of the interconnect size effect. Further, the electron scattering off wire interfaces can be diffused or specular. Diffused scattering is responsible for electron momentum transfer into wire sidewalls, negatively affecting copper effective resistivity. Specular scattering does not result into electron momentum transfer and does not affect copper effective resistivity. Engineering copper wire interfaces is directed toward increasing specular scattering component over diffused scattering component. This can further suppress the interconnect size effect bringing effective copper resistivity closer to the bulk value.

Figure 7:
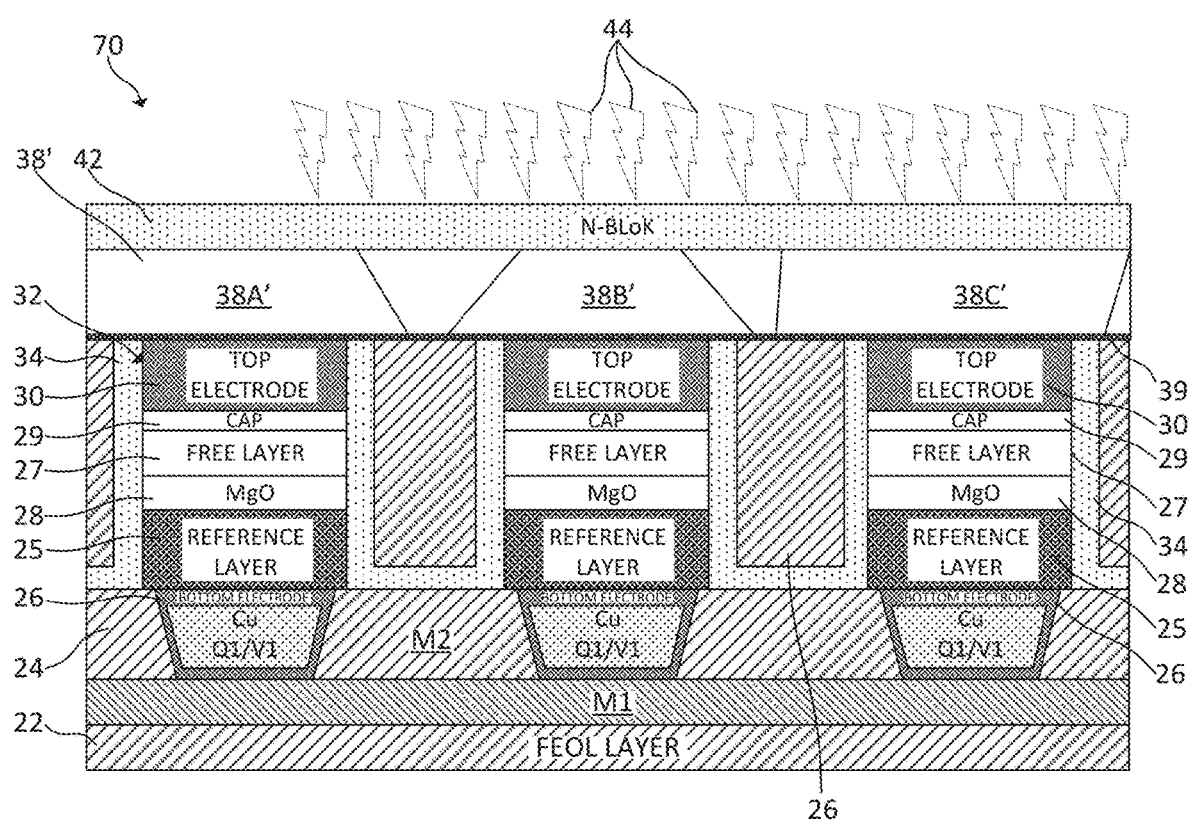
FIG. 7. is a schematic, cross-sectional view thereof showing a laser anneal to melt the top copper line and forming a top copper line having relatively large grains and improved interfaces upon recrystallization thereof.

The top (M3) copper bitline 38, which is electrically connected to the underlying top electrodes 30 of the MTJ pillars by via conductors, is laser annealed and then cooled. The laser annealing process causes the top copper line to melt for a very short duration while the liner 39, the top electrodes 30, metal capping layers 29 and free layers 27 remain in a solid state. The magnetic properties of the MTJ pillars 32 are essentially unaffected by the laser annealing and recrystallization of the M3 copper bitline 38. Recrystallization of the M3 copper bitline 38 originates from the top surfaces of the top electrodes 30 or the liner portions 39 thereon. The grain size of a metal or single phase metal alloy is an estimate of the average grain dimension. A recrystallized top (M3) copper bitline 38' having relatively large grains (for example, larger than 0.06 μm), increased specular scattering off wire interfaces, and, consequently, lower electrical resistance and effective resistivity is formed, as schematically illustrated in FIG. 7. An optically opaque sacrificial absorber layer (not shown) is optionally deposited on the top dielectric capping layer 42 prior to laser annealing is some embodiments. The purpose of such sacrificial layer is to uniformly absorb laser radiation irrespective of metal line materials including any of its capping layers and liner materials and their pattern density. The sacrificial absorber layer can be a conductive film such as tantalum nitride or titanium nitride with its thickness sufficient for absorbing all or most of the laser radiation. The sacrificial absorber film is removed selectively to the top dielectric capping layer 42 after laser annealing.

The term "laser annealing" denotes an annealing method that employs a laser to induce heat in the metal interconnects being treated. A laser is an electro-optical device that emits coherent radiation 44. In some embodiments, a typical laser emits light in a narrow, low-divergence beam and with a defined wavelength. One advantage of employing laser irradiation for annealing processes is that its light can be easily shaped and focused onto a specific area of the annealing surface to achieve very high radiation intensity or energy density with short exposure durations.

In some embodiments, the short exposure duration is achieved by raster scanning focused laser beam over the substrate surface including the dielectric passivation layer 42, the top (M3) copper bitline 38, and the MTJ pillars 32. In this case, the exposure duration measured at incident intensity Full Width at Half Maximum (FWHM) is the beam width in the scanning direction divided by the scanning velocity. In alternative embodiments, the short exposure duration is achieved by employing a pulsed laser. In this case, the laser beam is shaped to achieve a required peak intensity over a selected substrate area such as over an entire product die or its portion and the laser is operated in a pulsed mode such as in the case of Q-switched laser. The pulse duration of Q-switched laser at intensity FWHM determines the substrate exposure time. The exposure process is repeated for the entire wafer surface in a step-and-repeat approach with some targeted beam overlap for adjacent exposures. In some embodiments, the exposure of wafer surface to the laser beam, includes 1 pulse to 100 pulses of light exposure. In the case of multiple laser pulses, a total cumulative duration (defined by multiplying number of pulses to their respective durations at full width at half maximum) is from 100 to 3,000 nanoseconds.

In some embodiments, the laser type that is employed in the laser annealing method of the present application is selected from a solid-state Nd:YAG laser emitting at 1064 nm and frequency-doubled or -tripled emitting at 532 nm or 355 nm, respectively, or an excimer laser emitting at below 400 nm. Excimer lasers can be powered by a chemical reaction involving an excited dimer, or excimer, which is a short-lived dimeric or heterodimeric molecule formed from two species (atoms), at least one of which is in an excited electronic state. Commonly used excimer molecules include F2 (fluorine, emitting at 157 nm), and noble gas compounds such as ArF (193 nm), KrCl (222 nm), KrF (248 nm), XeCl (308 nm), and XeF (351 nm). Excimer lasers are usually operated in a Q-switched, pulsed mode suitable for step-and-repeat pulsed wafer exposure. Solid-state Nd:YAG lasers provide an alternative to excimer lasers due to its stable, high-power output at 1,064 nm that can be efficiently frequency doubled or tripled emitting radiation at 532 nm or 355 nm. Solid state lasers can be configured in continuous, pulsed, or Q-switched pulsed modes suitable for both raster scanning and step-and-repeat pulsed operation. The laser wavelength selection is important for coupling laser radiation into suitable absorbing materials. Common dielectric materials are either not absorbing or only weakly absorbing (e.g., absorbing less than 5% of the coupled radiation) even at a short wavelength of from about 350 nm to about 250 nm. Metals and metallic compounds, on the other hand, absorb radiation at a wavelength of about 600 nm or shorter making shorter wavelength laser more preferred for structures with metallic layers such as copper bitlines as described herein. In some embodiments, an XeCl laser (308 nm) can be employed coupling about 30-70% of its incident radiation into the top (M3) copper bitline 38 and the MTJ pillar 32.

Once the substrate including the dielectric passivation layer 42, the top copper bitline 38, and the MTJ pillar 32 is exposed to the laser radiation either through raster scanning or through a laser pulse, the temperature of the top copper bitline 38 and MTJ pillar 32 begins rising from its base value and falls shortly after. The rising temperature of the top copper bitline 38 and MTJ pillars 32 causes thermal energy or heat to flow into adjacent structures including the dielectric passivation layers 34, 36, 42 and underlying bottom electrode structures 26, raising their temperatures in lock step with that of top copper bitline 38 and MTJ pillars 32. A representative temperature-time trace of a nanosecond laser anneal process includes four (4) distinct temperature regions: initial or base substrate temperature, heat-up portion, temperature peak point, and cool down portion. Such triangular temperature-time profile or trace is often referred to as spike anneal or laser spike anneal. Initial or base substrate temperature may be within the range of from 23° C. (room temperature) to 400° C. This temperature is typically set by a hot plate on which the substrate resides. Alternative heating devices may also be used to keep the substrate at a base temperature. Such alternative or additional heating devices can include backside or frontside lamp annealing, microwave heating, and secondary millisecond-scale pre-heat laser beams. A laser beam having a wavelength at near 308 nm raises the surface temperature of substrate including the top (M3) copper bitline 38 and the MTJ pillar 32 from the base temperature to the peak value with the ramp up rate from about 1,000,000,000° C./sec to about 100,000,000,000° C./sec. The temperature of adjacent structures including bottom electrode structures 26 rises in lock step with the temperature of copper line 38 and the MTJ pillar 32 but a slightly reduced rate such that its peak value is 20° C. to 100° C. lower than the peak temperature of copper bitline 38. After laser radiation exposure, the surface temperature including that of the top copper bitline 38 and the MTJ pillar 32 quickly drops back to the base temperature with the temperature ramp down rate of from about 300,000,000° C./sec to about 30,000,000,000° C./sec. The anneal duration measured at around the temperature peak point, typically at a level 50° C. below the peak point, ranges from about 1 nanosecond to about 500 nanoseconds but from about 10 to about 100 nanoseconds is more typical. It is customary to specify the process duration of laser anneals in terms of the radiation exposure duration at FWHM rather than the anneal duration at the temperature level 50° C. below the peak temperature. These duration quantities are related to each other and, in some embodiments, the anneal duration is a fraction (e.g., about ⅓) of the radiation exposure duration.

Laser-induced surface temperature rise is set by the laser incident radiation intensity, laser pulse or exposure duration, and optical and thermal properties of the dielectric passivation layer 42, the top copper bitline 38, the MTJ pillar 32, and underlying substrate structures. Short frontside laser exposure causes a non-uniform heating of these substrate structures. The heat penetration depth in the case of nanosecond-scale laser pulses ranges from about 1 micron to about 5 microns in homogeneous metallic structures such as copper lines and from about 100 nanometers to about 500 nanometers in typical interconnect dielectrics. In addition, the temperature drop across heterogeneous interfaces is typically less than 10° C. for metal-metal interfaces and less than 100° C. for dielectric interfaces. Accordingly, the top copper bitline 38 and the MTJ pillar 32 are heated with a small top-to-bottom temperature gradient of approximately 0.1-0.3° C./nm, the top copper bitline 38 having a higher peak temperature than the bottom electrode 26. The temperature gradient in the dielectric structures is several times larger and typically 0.3-3° C./nm.

It will be appreciated that the required radiation intensity at which the M3 copper bitline 38 reaches a target anneal temperature range of above the copper melting point (1090° C.) depends on specific underlying substrate structures, laser pulse duration, and selected laser wavelength. However, the required incident radiation intensity can be determined experimentally for specific substrate structures and annealing parameters by observing copper bitline 38 melting at about 1090° C. In some embodiments, the nanosecond laser wavelength is 308 nm, the substrate base temperature is 250° C., the pulse duration at FWHM is 160 nanoseconds, and the coupled laser energy density at which the top copper bitline 38 at the M3 level or higher starts to melt is 0.1 J/cm$^2$ (this corresponds to 0.16 J/cm$^2$ of incident laser energy density). The exact metal level of the top copper bitline 38 or, equivalently, the amount of thermal isolation from the FEOL substrate 22 may alter this threshold. Presence of metallic caps, barriers, and wetting layers such as TaN, Ru, Co, Ta in the copper bitline 38 may also alter this threshold. The pattern density of the top copper bitlines 38, MTJ pillars 32, and bottom interconnect structures may also alter this threshold. While the substrate structures and the laser parameters can vary, thereby affecting the choice of the incident laser energy density, the range of incident laser energy density from about 0.05 J/cm$^2$ to about 3 J/cm$^2$ and laser radiation exposure duration from about 5 to about 200 nanoseconds can be employed to melt top copper bitline 38. In some embodiments, the top copper bitline 38 is melted multiple times by exposure to multiple laser pulses with cumulative duration of from about 100 to about 3,000 nanoseconds.

After laser radiation exposure, the temperature of the top copper bitline 38 starts quickly dropping, bringing liquid copper to below its melting/solidification point. Liquid copper begins solidification process by nucleating a solid copper seed and laterally growing copper grain from the seed. Excessive random nucleation of solid copper seeds may result in small copper grains due to competing lateral growth from adjacent, closely-spaced copper seeds. The presence of the MTJ pillars 32 underneath the copper bitline 38 provides effective local heat sinks, causing relatively colder spots in the portions of the copper bitline 38 directly above the MTJ pillars and easing solid copper seed nucleation in such colder locations. This effectively programs the positions of solid copper seeds in top copper bitline 38.

Spacing adjacent MTJ pillars along the top copper bitline 38 by about 60 nm or more results in a large-grain copper line 38' having a structure 70 as schematically illustrated in FIG. 7. In addition, any impurities immiscible in liquid copper are pushed out from copper into surfaces and grain boundaries resulting in more pure copper lines with superior electrical properties. Further, solidification of liquid copper reforms copper/liner interfaces, thereby increasing the specular scattering component. The use of immiscible-in-liquid-copper materials in the liner 39 and bitline 38 cap (not shown) directly adjacent to the elemental copper ensures that these materials do not incorporate into the copper wire interior and that the wire interior will comprise essentially pure elemental copper (or copper alloy if an alloy is employed) with its superior electrical conductivity. Conducting multiple consecutive copper melt anneals benefits both increasing average grain size and purifying copper from immiscible impurities. As illustrated in FIG. 7, bitline grains 38A', 38B', 38C' obtained upon completion of laser annealing/recrystallization cycle(s) as described herein are, respectively, vertically aligned with the three illustrated underlying MTJ pillars 32. Grain boundaries are located mainly in the bitline regions between the MTJ pillars and over the spaces containing the encapsulation and dielectric layers 34, 36.

As the end result of copper line melting and recrystallization, the effective copper resistivity is reduced close to the bulk copper resistivity of ~1.7 μΩ cm. In some embodiments, the copper wire size effect is reduced by half or more, meaning that the relative increase in effective copper wire resistivity over the bulk copper resistivity per given wire cross-sectional area is cut in half or more. For instance, the effective resistivity a copper bitline with copper cross-sectional area of 2000 nm$^2$ is reduced from about 3.7 to about 2.7 or by more than 25% or, equivalently, the increase of effective bulk resistivity over bulk resistivity (~2 μΩ cm) is cut in half to 1 μΩ cm.

An ultrashort laser pulse such as described above avoids damage to the dielectric materials in the dielectric cap layer 42 and the ILD layer 36 as well as the layers comprising the MTJ pillars 32. The feasibility of laser annealing techniques as described above with respect to top copper bitlines formed above MRAM pillars is demonstrated in FIGS. 8A and 8B. The graphs in both figures further show the temperatures at which copper and CoFeB melt and the thresholds for MTJ functional degradation. The exemplary MTJ pillar 32 (shown in earlier figures) contains functional materials including a CoFeB alloy sensitive to high-temperature (above 400° C.) anneals due to their relatively low melting point. Furthermore, low-temperature (below 400° C.) post-processing is typically required to prevent diffusion of metallic elements across the tunnel barrier layer of the MTJ pillar 32 that may lead to device shorting. The melting point of MTJ functional material and a corresponding damage threshold in the incident laser energy density was determined experimentally for an exemplary blanket MTJ stack and exemplary laser annealing parameters by observing the MTJ stack electrical functionality before and after laser annealing. The exemplary MTJ stack contained copper top electrode capped with a ruthenium (Ru) cap. Different optical reflectance of Ru at 308 nm and the different pattern density (blanket film) shifted the copper melting threshold to 0.37 J/cm$^2$ of incident laser radiation. Accordingly, in this example, the targeted annealing temperature range of from about 1000° C. to about 1300° C. will require the incident laser energy density to be from 0.33 J/cm$^2$ to 0.46 J/cm$^2$.

Figure 8A:
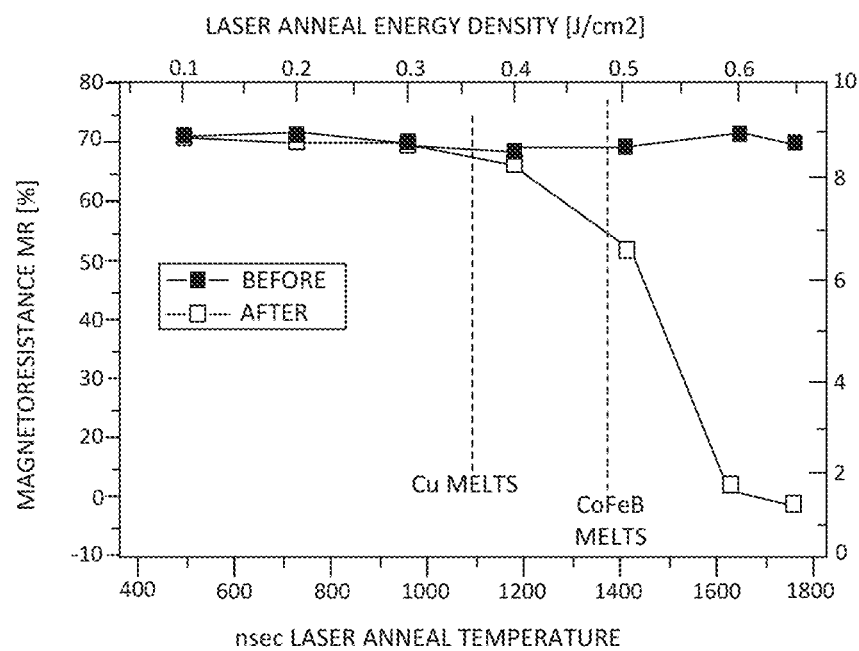
FIG. 8A is a graph showing tunneling magnetoresistance as a function of laser thereof following forming of a top copper line over the structure shown in FIG. 5 and deposition of a top capping layer over the top copper line; anneal temperature.
Figure 8B:
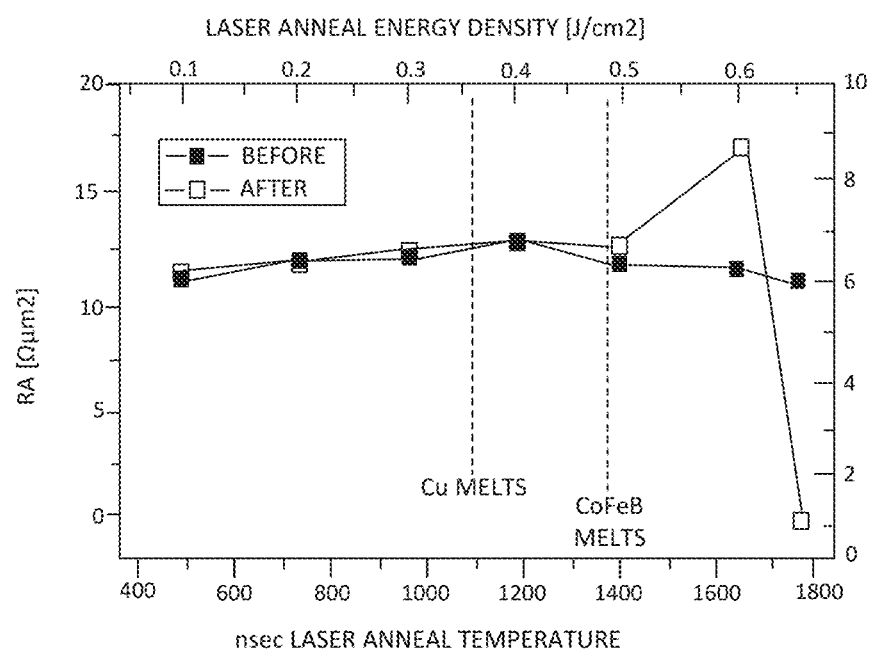
FIG. 8B is a graph showing product of resistance and area (RA) as a function of laser anneal temperature.

FIG. 8A shows changes in a MTJ parameter known as tunneling magnetoresistance for a range of incident laser energy density measured in J/cm$^2$ and calibrated peak anneal temperatures obtained. A higher magnetoresistance is desirable. As shown in FIG. 8A, laser annealing of the top copper bitline (element 38 in FIG. 6) can be conducted up to 1150° C. without material degradation of the magnetic tunnel junction as the magnetoresistance is substantially unchanged at and below this temperature. The magnetoresistance drops/degrades substantially at higher anneal temperatures and higher laser energy densities above about 0.4 J/cm$^2$. Similarly, FIG. 8B shows a different MTJ parameter known as Resistance-Area (RA) product before and after laser annealing showing no degradation for up to 0.4 J/cm². A relatively low RA at a given magnetoresistance value is desirable. The RA increases/degrades at higher laser anneal energy densities. This demonstrates that the copper bitline 38 can be melted for durations of from 10's to 100's of nanoseconds without causing any degradation in MTJ pillars 32 located below the copper lines 38/38'.

The drawing figures as discussed above depict exemplary processing steps/stages in the fabrication of exemplary structures. Although the overall fabrication methods and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling 1st Edition*, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

Figure 4:
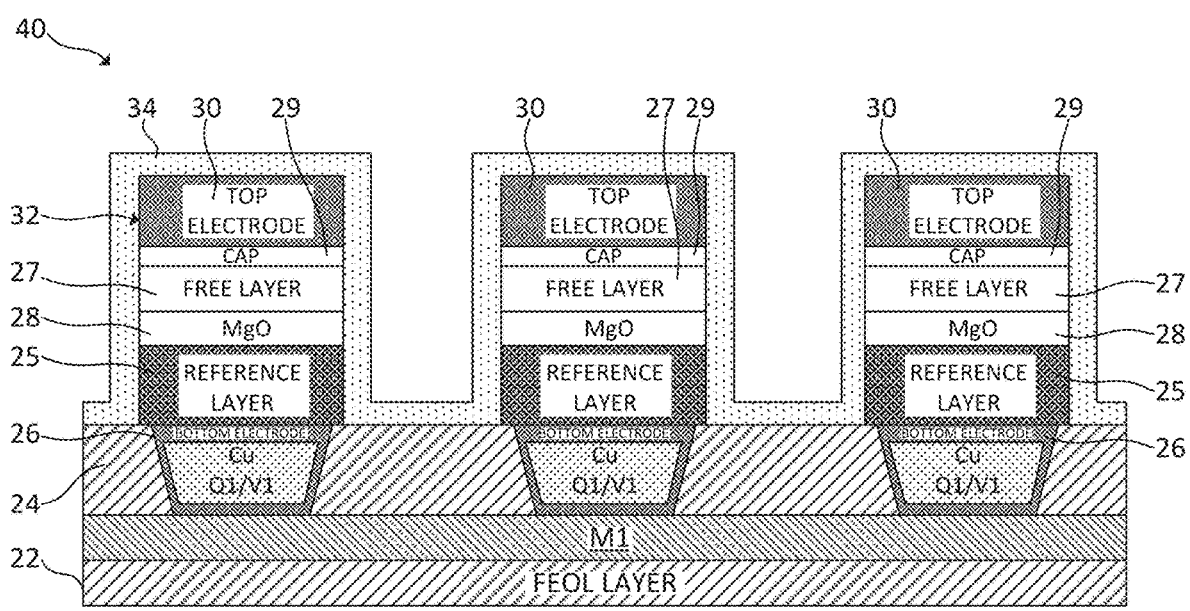
FIG. 4 is a schematic, cross-sectional view thereof following nitride encapsulation of the MTJ pillars and associated caps and electrodes.

Given the discussion thus far, it will be appreciated that, in general terms, a method of forming MRAM structures including improved, large-grain copper top interconnect lines (bitlines) includes obtaining a first structure including a device wafer 22 comprising electronic devices and a metallized layer M2 over the device wafer and including bottom electrodes 26 electrically connected to the electronic devices. Vertical pillars 32 are formed having sidewalls above the metallized layer, the vertical pillars each including a magnetic tunnel junction and a top electrode 30. A barrier (encapsulation) layer 34 is formed on the sidewalls of the pillars 32 and may initially encapsulate the pillars, as shown in FIG. 4. A dielectric layer 36 is deposited between the sidewalls of the vertical pillars. A top copper bitline 38 is formed on the top electrodes and has relatively small grains, as schematically illustrated in FIG. 6, a width of 40 nm or less and a cross-sectional area of 3,000 nm² or less. A capping layer 42 is deposited over the top copper bitline, wherein an exemplary structure 60 as illustrated in FIG. 6 may be obtained. The top or M3 copper bitline is melted one or multiple times by laser irradiation without materially affecting the magnetic properties of the magnetic tunnel junctions within the pillars 32. The method further includes recrystallizing the top copper bitline 38 during a cool down period following the laser irradiation to form relatively large grains therein and improved interfaces. Recrystallization of the top copper bitline proceeds upwardly from the top electrodes 32. Laser annealing parameters are selected to form large grains in the bitline without damaging the MTJ pillars. Exemplary parameters include a laser wavelength of less than 600 nm, laser exposure time range of 1-500 nanoseconds and cumulative laser exposure time of 100-3,000 nanoseconds. The structure may be subjected to, for example, 1-100 laser annealing and cool-down cycles at temperatures below 1150° C.

The adjacent MTJ pillars 32 and their top electrodes 30 are spaced more than 60 nm apart along the bitline 38' resulting in average copper grain size of more than 60 nm in one or more embodiments. The copper grain boundaries are located mainly in between adjacent MTJ pillars as illustrated in FIG. 7 while the copper grains are vertically aligned with the vertical MTJ pillars. A MTJ pillar pitch greater than sixty nanometers along the bitline 38' still allows a high density of MTJ cells, with an area of the individual MTJ cell of less than 0.01 µm² in one or more embodiments. The effective resistivity of the bitline 38' is reduced by more than 25% and the increase of effective bulk resistivity over bulk resistivity is cut in half or more as compared to the bitline 38 described above with respect to FIG. 6. A structure 70 as schematically illustrated in FIG. 7 may accordingly be obtained.

Memory arrays obtained in accordance with the principles of the inventions described herein include MTJs and large grain top copper bitlines having cross-sectional areas of less than 3,000 nm², low access resistance, grains that are vertically aligned to the vertically extending MTJ pillars, and grain boundaries located mainly between adjacent pillars. In one or more embodiments, the pitch of the MTJ pillars along the bitline 38' is sixty nanometers (60 nm) or more, which allows formation of relatively grains. Individual MRAM cell areas of less than 0.01 µm² are provided in exemplary memory arrays. The relatively large grains of the recrystallized copper bitlines have an average grain size larger than 0.06 µm after recrystallizing the copper bitline (or more than two (2) times larger than the bitline width).

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having structures including magnetic tunnel junctions and associated bitlines formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this invention. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments may be referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" and "vertical" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b). It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method of forming large grain copper bitlines for an electronic structure, comprising:
   obtaining an MRAM structure including:
      a device wafer comprising electronic devices;
      a metallized layer over the device wafer and including bottom electrodes therein, the bottom electrodes being electrically connected to the electronic devices; and
      vertical pillars having sidewalls above the metallized layer, the vertical pillars each including a magnetic tunnel junction and a top electrode;
   forming a copper bitline exhibiting a copper wire size effect over the top electrodes, the copper bitline having a width of forty nanometers or less, an area of three thousand square nanometers or less, and copper grains having relatively small sizes with respect to the width of the copper bitline;
   laser annealing the copper bitline, thereby melting the copper bitline; and
   recrystallizing the copper bitline during a cool down period following the laser annealing, thereby forming relatively large grains therein and reducing the copper wire size effect of the copper bitline formed over the top electrodes.

2. The method of claim 1, wherein the relatively large grains formed by recrystallizing the copper bitline are vertically aligned with the vertical pillars and include grain boundaries that are mostly over a plurality of spaces between the vertical pillars, and further wherein the vertical pillars have a pitch of sixty nanometers or more along the copper bitline.

3. The method of claim 1, wherein the relatively large grains have an average grain size larger than 0.06 μm after recrystallizing the copper bitline, further wherein recrystallizing the copper bitline includes reducing the copper wire size effect by half or more.

4. The method of claim 3, wherein the copper bitline includes copper at an atomic concentration of at least ninety percent.

5. The method of claim 4, wherein the MRAM structure further includes a dielectric layer between each of the vertical pillars, the relatively large grains including grain boundaries extending mostly over the dielectric layer.

6. The method of claim 5, wherein the laser annealing is conducted at a laser anneal density of from 0.05 to 3 J/cm$^2$.

7. The method of claim 6, wherein the tunneling magnetoresistance of each magnetic tunnel junction is substantially the same prior to and subsequent to recrystallizing the copper bitline.

8. The method of claim 6, wherein the MRAM structure further includes a metal liner immiscible in liquid copper and extending over the top electrodes and the dielectric layer, further forming the copper bitline directly on the metal liner.

9. The method of claim 1, wherein the vertical pillars have a pitch along the copper bitline at least sixty nanometers.

10. The method of claim 9, wherein laser annealing the copper bitline comprises multiple consecutive copper melt anneals.

11. A method of forming large grain copper bitlines for an electronic structure, comprising:
    obtaining an MRAM structure including:

vertical pillars having a pitch of sixty nanometers or more, each of the vertical pillars including a magnetic tunnel junction and a top electrode;

a plurality of spaces respectively between and separating each of the vertical pillars; and a dielectric layer filling each of the plurality of spaces between the vertical pillars;

forming a copper bitline over the top electrodes and along the pitch of the vertical pillars and extending over the spaces between the vertical pillars, the copper bitline having a width of forty nanometers or less, an area of three thousand square nanometers or less, and copper grains having relatively small sizes with respect to the width of the copper bitline;

laser annealing the copper bitline, thereby melting the copper bitline; and recrystallizing the copper bitline during a cool down period following the laser annealing, thereby forming relatively large grains therein that are vertically aligned, respectively, with the vertical pillars and having grain boundaries located mostly over the dielectric layer in the spaces between the vertical pillars.

12. The method of claim 11, wherein laser annealing the copper bitline comprises multiple consecutive copper melt anneals and recrystallizing the copper bitline includes multiple cool down periods between the consecutive copper melt anneals.

13. The method of claim 11, wherein the laser annealing is conducted at a laser anneal density of from 0.05 to 3 $J/cm^2$.

14. The method of claim 11, wherein the MRAM structure further includes a metal liner immiscible in liquid copper and extending over the top electrodes and the dielectric layer, further including forming the copper bitline directly on the metal liner.

15. The method of claim 14, wherein laser annealing the copper bitline includes causing an anneal at or below 1150° C., the metal liner remaining in a solid state during laser annealing.

* * * * *